(12) United States Patent
Noble

(10) Patent No.: US 6,509,213 B2
(45) Date of Patent: *Jan. 21, 2003

(54) METHODS OF FORMING TRANSISTORS AND CONNECTIONS THERETO

(75) Inventor: Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 73 days.

This patent is subject to a terminal disclaimer.

(21) Appl. No.: 09/736,547

(22) Filed: Dec. 11, 2000

(65) Prior Publication Data

US 2001/0000757 A1 May 3, 2001

Related U.S. Application Data

(63) Continuation of application No. 09/392,072, filed on Sep. 8, 1999, now Pat. No. 6,225,147, which is a continuation of application No. 08/846,110, filed on Apr. 25, 1997, now Pat. No. 6,004,835.

(51) Int. Cl.$^7$ .............................................. H01L 21/00
(52) U.S. Cl. ..................... 438/149; 438/151; 438/155; 438/161; 438/253; 438/396
(58) Field of Search ................................ 438/149, 151, 438/155, 161, 253, 396

(56) References Cited

U.S. PATENT DOCUMENTS 4,604,162 A    8/1986   Sobczak (List continued on next page.)

FOREIGN PATENT DOCUMENTS

EP          0 720 221 A1       7/1996

OTHER PUBLICATIONS

Kuge et al., *SOI–DRAM Circuit Technologies For Low Power High Speed Multigiga Scale Memories,* IEEE Journal of Solid State Circuits, Apr. 1996, pp. 586–591.

(List continued on next page.)

*Primary Examiner*—John F. Niebling
*Assistant Examiner*—Lynn A. Gurley
(74) *Attorney, Agent, or Firm*—Wells St. John P.S.

(57) ABSTRACT

In one aspect, the invention provides a method of forming an electrical connection in an integrated circuitry device. According to one preferred implementation, a diffusion region is formed in semiconductive material. A conductive line is formed which is laterally spaced from the diffusion region. The conductive line is preferably formed relative to and within isolation oxide which separates substrate active areas. The conductive line is subsequently interconnected with the diffusion region. According to another preferred implementation, an oxide isolation grid is formed within semiconductive material. Conductive material is formed within the oxide isolation grid to form a conductive grid therein. Selected portions of the conductive grid are then removed to define interconnect lines within the oxide isolation grid. According to another preferred implementation, a plurality of oxide isolation is regions are formed over a semiconductive substrate. Conductive material is formed which is received within at least one of the isolation regions. In one preferred implementation, a silicon-on-insulator. (SOI) substrate is utilized to support integrated circuitry which is formed utilizing the methodical aspects of the invention. In another preferred implementation, other substrates, such as conventional bulk substrates are utilized.

31 Claims, 12 Drawing Sheets

U.S. PATENT DOCUMENTS

| | | | |
|---|---|---|---|
| 4,700,461 | A | 10/1987 | Choi et al. |
| 5,011,783 | A | 4/1991 | Ogawa et al. |
| 5,214,603 | A | 5/1993 | Dhong et al. |
| 5,391,911 | A | 2/1995 | Beyer et al. |
| 5,539,229 | A | 7/1996 | Noble, Jr. et al. |
| 5,599,724 | A | 2/1997 | Yoshida |
| 5,608,248 | A | 3/1997 | Ohno |
| 5,763,931 | A | 6/1998 | Sugiyama |
| 5,831,305 | A | 11/1998 | Kim |
| 5,846,854 | A | 12/1998 | Giraud et al. |
| 6,004,835 | A * | 12/1999 | Noble ......................... 438/149 |
| 6,004,865 | A | 12/1999 | Horiuchi et al. |
| 6,091,129 | A | 7/2000 | Cleeves |
| 6,117,760 | A | 9/2000 | Gardner et al. |
| 6,225,147 | B1 * | 5/2001 | Noble ......................... 438/149 |
| 6,274,919 | B1 | 8/2001 | Wada |
| 6,373,138 | B1 | 4/2002 | Noble |

OTHER PUBLICATIONS

Suma et al., *An SOI–DRAM With Wide Operating Voltage Range by CMOS/SIMOX Technology, IEEE Journal of Solid State Circuits,* Nov. 1994, pp. 1323–1329.

Bakeman et al., *A High Performance 16–Mb DRAM Technology, 1990 Symposium on VLSI Technology Digest of Technical Papers,* Honolulu, HI, Jun. 4–7, pp. 11–12.

Kohyama et al., *Buried Bit Line Cell for 64MB DRAMs, IEEE 1990 Symposium on VLSI Technology,* pp. 17–18.

Davari et al., *A Variable–Size Shallow Trench Isolation (STI) TechnologyWith Diffused Sidewall Doping for Submicron CMOS, IEDM Technical Digest, International Electron Devices Meeting,* San Francisco, CA, Dec. 11–14, 1988, pp. 92–95.

*Buried Stud that Eliminates Substrate and Well Contact Requirements,* IBM Web page, Jun. 1996, 2 pgs.

Takahiro Onai et al., "SEPIA: A New Isolation Structure for Soft–Error–Immune LSI's," 1993 IEEE 3 pages.

* cited by examiner

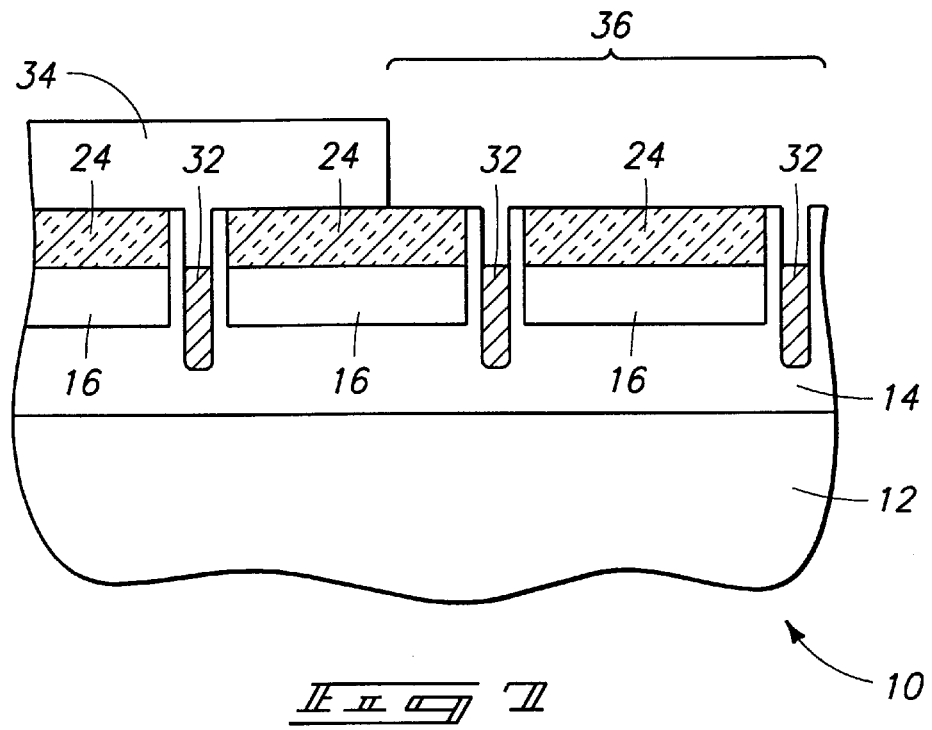
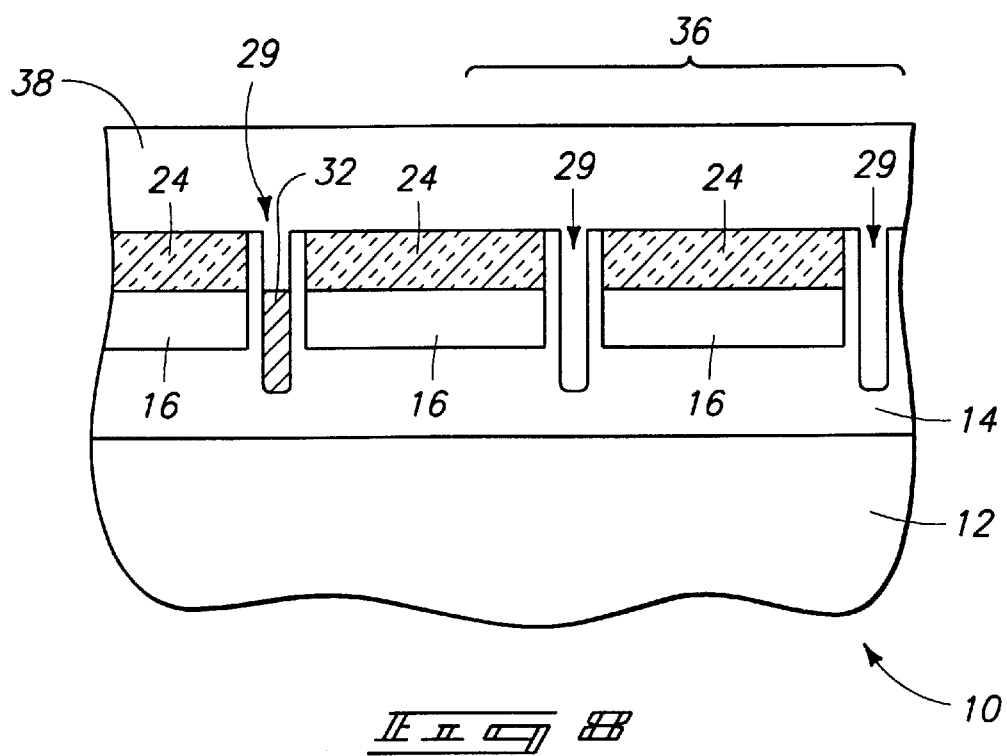

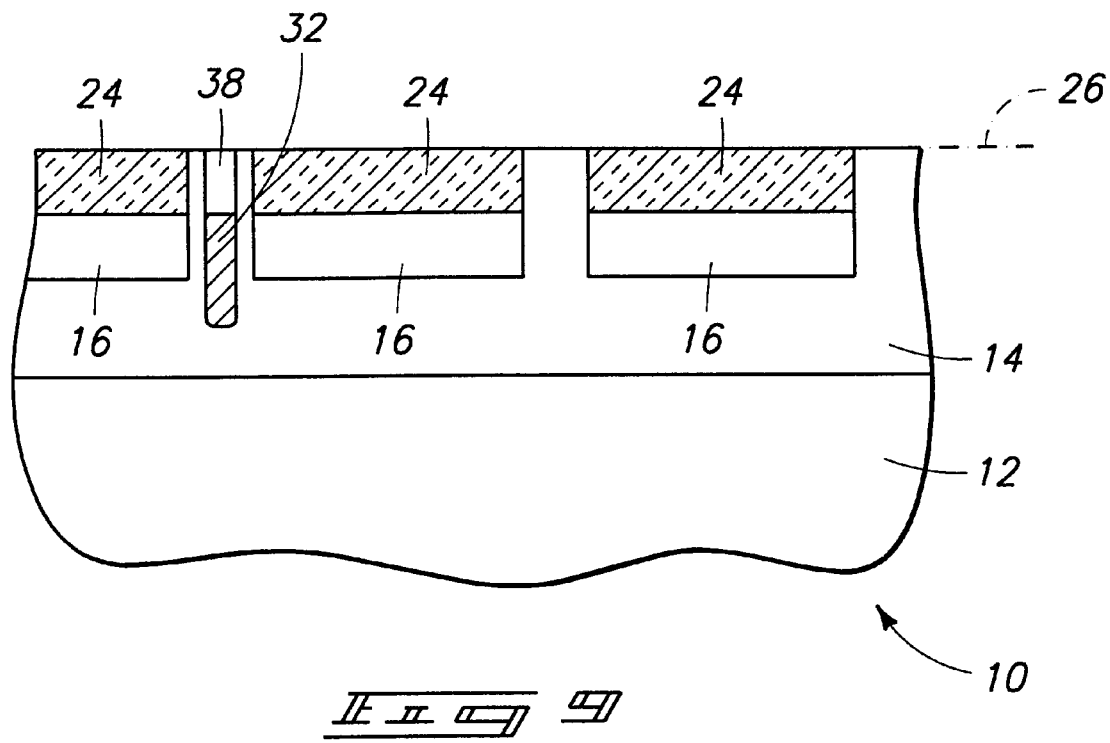
_Fig 9_
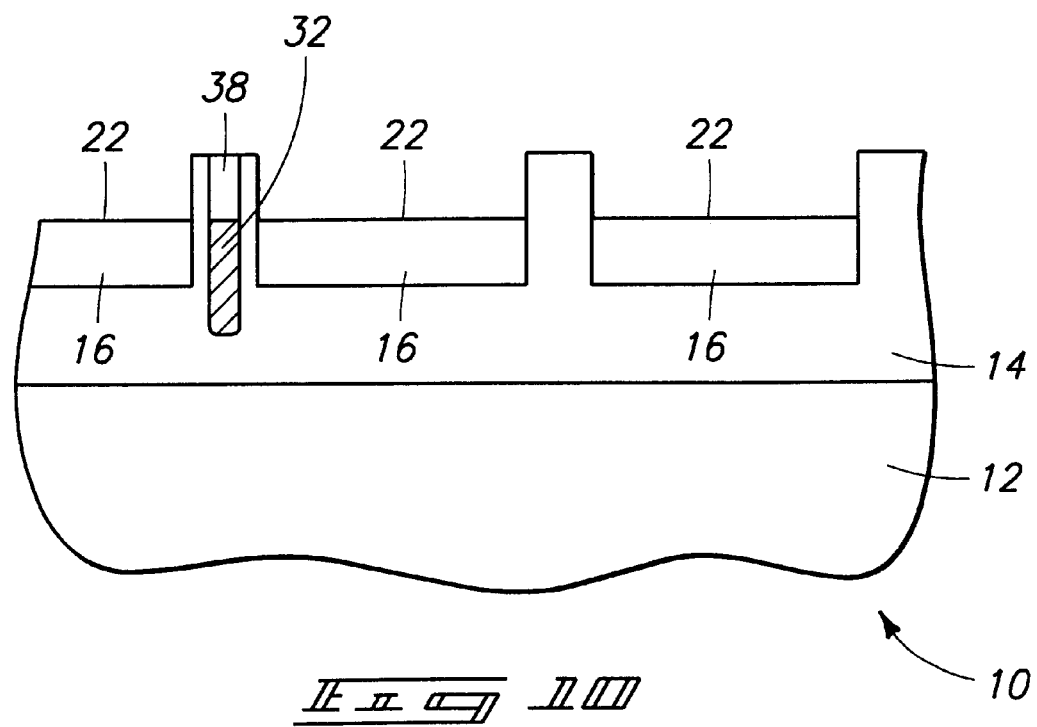
_Fig 10_

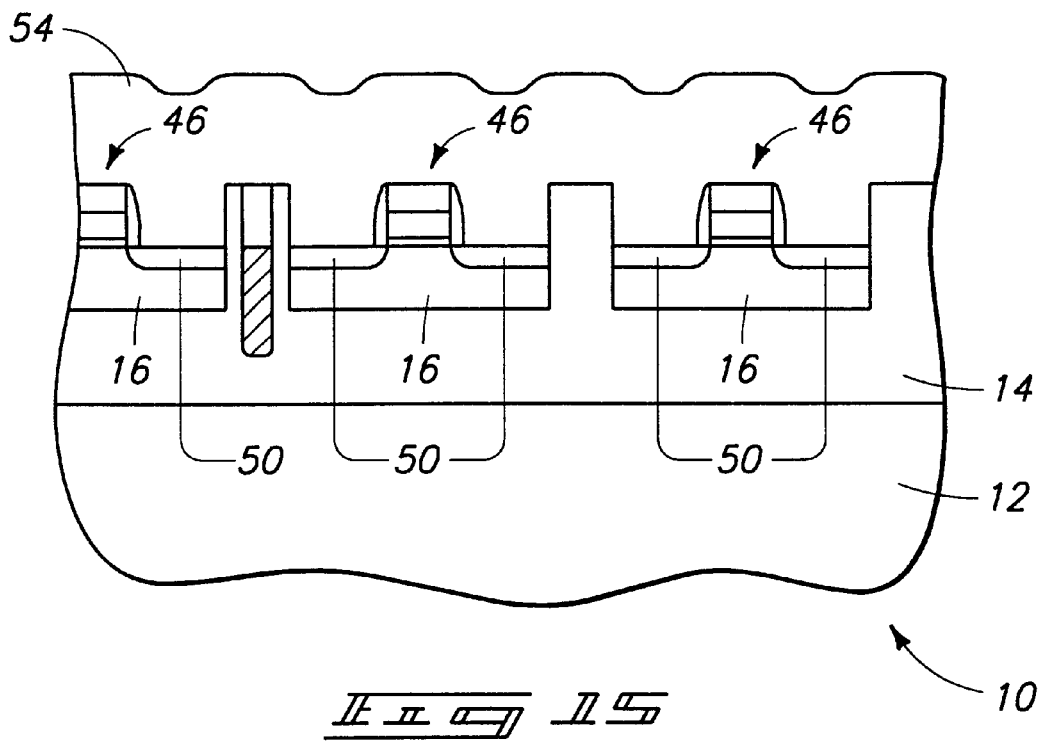
_Fig 15_
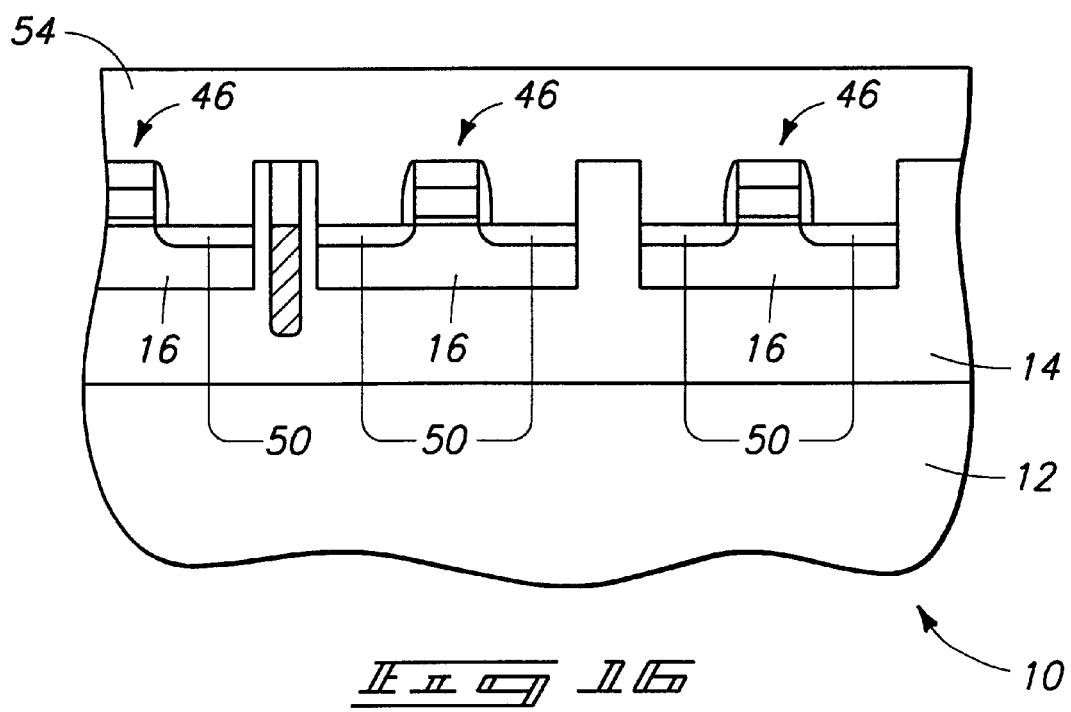
_Fig 16_

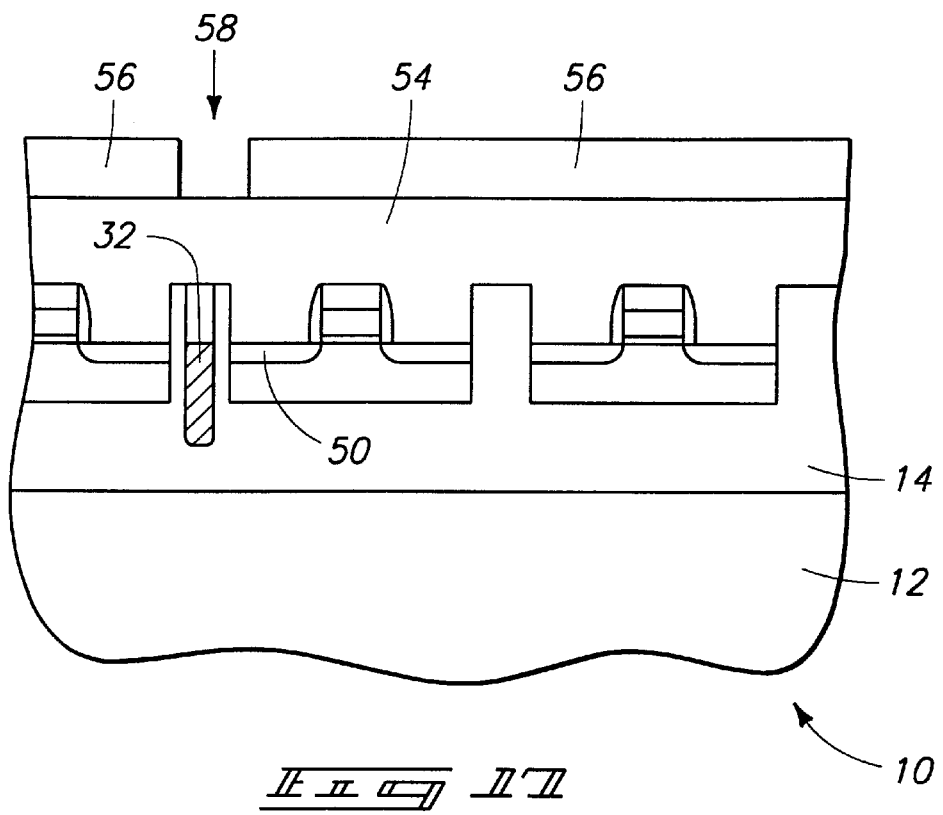
_Fig. 17_
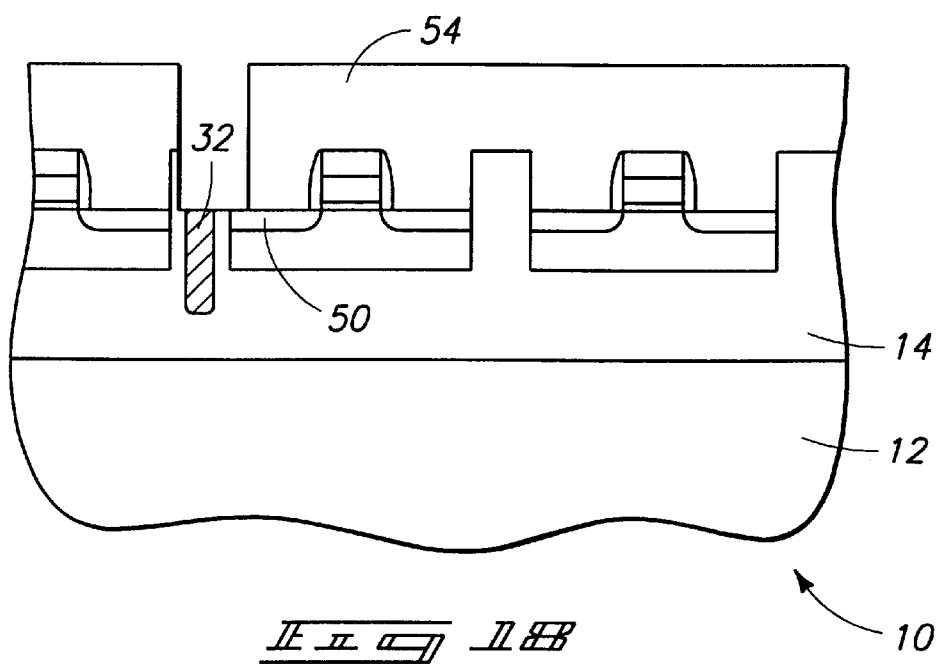
_Fig. 18_

METHODS OF FORMING TRANSISTORS AND CONNECTIONS THERETO

CROSS REFERENCE TO RELATED APPLICATION

This is a Continuation of U.S. patent application Ser. No. 09/392,072, filed Sep. 8, 1999, entitled "Semiconductor Processing Methods of Forming Integrated Circuitry, Forming Conductive Lines, Forming a Conductive Grid, Forming a Conductive Network, Forming an Electrical Interconnection to a Node Location, Forming an Electrical Interconnection With a Transistor Source/Drain Region, and Integrated Circuitry", now U.S. Pat. No. 6,225,147, which is a Continuation of U.S. patent application Ser. No. 08/846,110, filed Apr. 25, 1997, now U.S. Pat. No. 6,004,835.

TECHNICAL FIELD

This invention relates to semiconductor processing methods of forming integrated circuitry, forming conductive lines, forming a conductive grid, forming a conductive network, forming an electrical interconnection to a node location, forming an electrical interconnection with a transistor source/drain region, and related integrated circuitry.

BACKGROUND OF THE INVENTION

Semiconductor device fabrication typically involves fabrication of transistors relative to a substrate. One type of transistor is a MOS transistor which includes a conductive gate and diffusion regions which serve as the source and drain of the transistor. Individual transistors are often separated from one another by isolation regions which serve to electrically insulate transistor components from one another. One type of substrate upon which such transistors can be formed is a silicon-on-insulator (SOI) substrate which comprises individual islands of semiconductive material formed atop and surrounded by insulator material, which is typically an oxide material. Transistors are formed over or within semiconductive islands, with insulator material separating the islands. Another type of substrate upon which such transistors can be formed is a bulk semiconductive substrate such as monocrystalline silicon. Such substrates typically comprise active areas within which desired transistors are formed, with such areas being separated by oxide isolation regions.

Typically, electrical interconnections between transistors or other devices are formed by providing an insulating layer of material over the substrate and an associated transistor location with which electrical connection is desired, and then etching a contact opening through the insulating material to the transistor location. Subsequently, conductive material is deposited within the contact opening and electrically connects with the desired transistor location. Forming an interconnection in this manner requires at least one additional layer of material (the BPSG material) and additional processing steps which prolong the fabrication process.

One type of integrated circuitry in which the above electrical interconnections can be made is dynamic random access memory (DRAM) circuitry. DRAM cells utilize storage capacitors which are operably associated with MOS transistors. Storage capacitors are typically formed, within and relative to insulating material which is formed over the substrate. The amount of charge a particular capacitor can store is proportional to the amount of capacitor storage node surface area. As DRAM dimensions grow smaller, there is a push to maintain storage capacitance values despite denser circuitry.

This invention grew out of concerns associated with improving the manner in which wafer space is utilized to support integrated circuitry constructions. This invention also grew out of concerns associated with improving the manner in which integrated circuitry electrical interconnections are formed.

SUMMARY OF THE INVENTION

In one aspect, the invention provides a method of forming an electrical connection in an integrated circuitry device. According to one preferred implementation, a diffusion region is formed in semiconductive material. A conductive line is formed which is laterally spaced from the diffusion region. The conductive line is formed relative to and within isolation oxide which separates substrate active areas. The conductive line is subsequently interconnected with the diffusion region. According to another preferred implementation, an oxide isolation grid is formed within semiconductive material. Conductive material is formed within the oxide isolation grid to form a conductive grid therein. Selected portions of the conductive grid are then removed to define interconnect lines within the oxide isolation grid. According to another preferred implementation, a plurality of oxide isolation regions are formed over a semiconductive substrate. Conductive material is formed which is received within at least one of the isolation regions.

In one preferred implementation, a silicon-on-insulator (SOI) substrate is utilized to support integrated circuitry which is formed utilizing the methodical aspects of the invention. In another preferred implementation, other substrates, such as conventional bulk substrates are utilized.

BRIEF DESCRIPTION OF THE DRAWINGS

Preferred embodiments of the invention are described below with reference to the following accompanying drawings.

FIG. 7 is a diagrammatic section of the FIG. 1 semiconductor wafer portion at a processing step which is subsequent to that shown in FIG. 6.

FIG. 8 is a diagrammatic section of the FIG. 1 semiconductor wafer portion at a processing step which is subsequent to that shown in FIG. 7.

FIG. 9 is a diagrammatic section of the FIG. 1 semiconductor wafer portion at a processing step which is subsequent to that shown in FIG. 8.

FIG. 10 is a diagrammatic section of the FIG. 1 semiconductor wafer portion at a processing step which is subsequent to that shown in FIG. 9.

FIG. 15 is a diagrammatic section of the FIG. 1 semiconductor wafer portion at a processing step which is subsequent to that shown in FIG. 14.

FIG. 16 is a diagrammatic section of the FIG. 1 semiconductor wafer portion at a processing step which is subsequent to that shown in FIG. 15.

FIG. 17 is a diagrammatic section of the FIG. 1 semiconductor wafer portion at a processing step which is subsequent to that shown in FIG. 16.

FIG. 18 is a diagrammatic section of the FIG. 1 semiconductor wafer portion at a processing step which is subsequent to that shown in FIG. 17.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
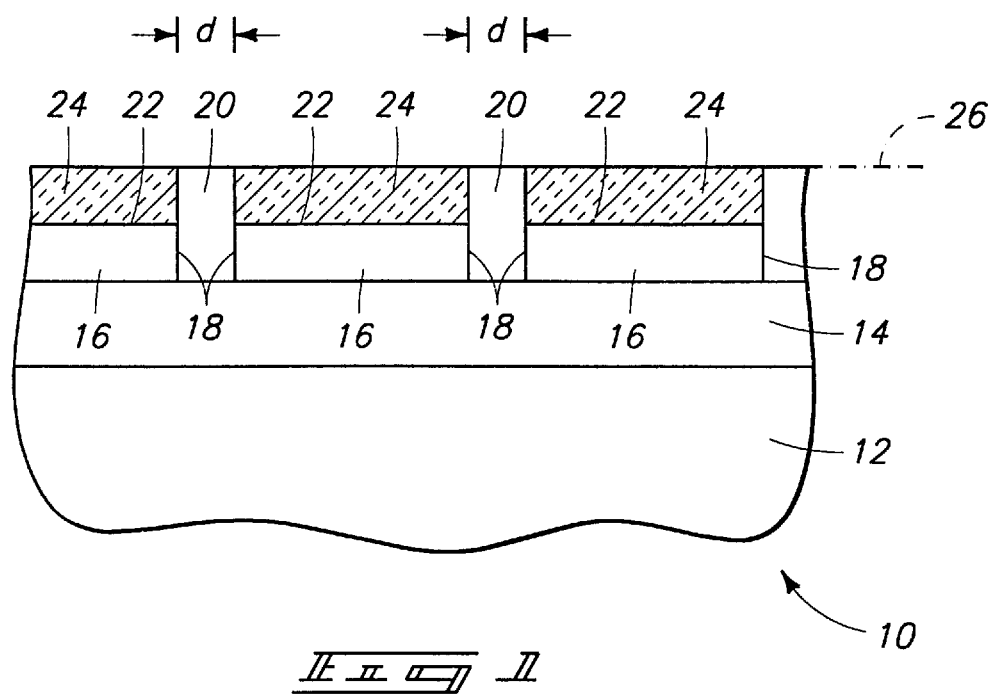
FIG. 1 is a diagrammatic section view of a portion of a semiconductor wafer at one processing step of a processing method in accordance with the invention.

Referring to FIG. 1, a fragmentary portion of a semiconductor wafer is designated by reference numeral 10. Wafer 10 constitutes a portion of integrated circuitry which is fabricated relative to a semiconductive substrate 12 which constitutes a portion of a semiconductive material-on-insulator (SOI) substrate. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 preferably comprises a portion of a bulk monocrystalline silicon substrate and supports a layer of insulative material 14 thereover. An exemplary material is $SiO_2$. A plurality of upstanding silicon-containing structures or semiconductive material islands 16 are formed over insulative material 14. Individual structures or islands 16 include respective sidewalls 18. Adjacent sidewalls 18 of different structures or islands 16 face one another and define respective separation distances d or spaces relative to and between other adjacent silicon-containing structures or islands.

Structures or islands 16 constitute spaced apart semiconductive material islands which are surrounded and separated by insulating material 20. Material 20 is formed in the spaces between the individual adjacent islands or structures. Individual structures 16 include respective outer surfaces 22. Nitride-containing caps 24 are formed over outer surfaces 22. Example individual silicon-containing island thickness is from about 1000–5000 Angstroms. Example thicknesses for individual nitride-containing caps 24 are from about 2000–4000 Angstroms. An exemplary material for caps 24 is $Si_3N_4$. Additionally, insulating material 20 is formed over the substrate and then preferably planarized as by suitable mechanical abrasion of the substrate to a degree which is sufficient to leave it generally coplanar with the nitride-containing caps 24. Such defines an outer plane 26. Accordingly, the entirety of the corresponding separation spaces between respective islands or structures 16 are occupied with the insulating material. An exemplary material for insulating material 20 is $SiO_2$ deposited by chemical vapor deposition.

One exemplary manner of forming the preferred silicon-containing structures 16 is as follows. A blanket pad structure is formed on a silicon-containing wafer. Preferably the blanket structure comprises a thin thermal oxide film and a thick nitride layer ($Si_3N_4$) which covers the thin oxide film. A first island pattern and etch is conducted which etches into the. silicon-containing wafer to a desired depth.. Such first etch defines a plurality or series of strips or bars which partially define island length or width dimensions. Such etch also defines an elevational depth of the islands to be formed. Insulating material, preferably $SiO_2$, can then be chemical vapor deposited into the strips or bars and planarized as by suitable mechanical abrasion of the substrate, with such planarization terminating at the nitride layer.

Subsequently, a second island pattern and etch can be conducted which etches into the silicon-containing wafer to a desired depth. Such second etch preferably defines a plurality or series of strips or bars which are generally orthogonally disposed relative to the strips or bars defined by the first island pattern and etch. The collective first and second etches define individual island length, width and to a certain extent, depth dimensions.

Nitride spacers are then formed over the island portions which were exposed by the second etch, island portions which were exposed by the first etch being covered by the $SiO_2$ insulating material mentioned above. Subsequently, an isotropic etch of silicon-containing material is conducted to a degree which is sufficient to completely undercut, the material and to form the preferred islands constructions. Such undercut islands are supported relative to the substrate by the previously formed $SiO_2$ insulating material which was deposited after the first island pattern and etch. Following the undercut etch, insulative material such as thermally grown oxide is formed beneath the islands to support the same relative to the substrate. Such insulative material corresponds to insulative material 14 of FIG. 1. An etch to remove the nitride spacers can be conducted at this point and subsequent insulating material can be chemical vapor deposited in the regions laterally adjacent the individual islands. Such insulating material corresponds to a portion of material 20 in FIG. 1. Subsequent planarization of the insulating material provides a wafer construction such as that shown in FIG. 1.

Alternately, the FIG. 1 construction could be provided by depositing an oxide layer over a bulk substrate, followed by depositing a silicon layer and a, nitride layer. Patterning could then be conducted. Oxide would thereafter be deposited and planarized back to produce the FIG. 1 construction.

Figure 21:
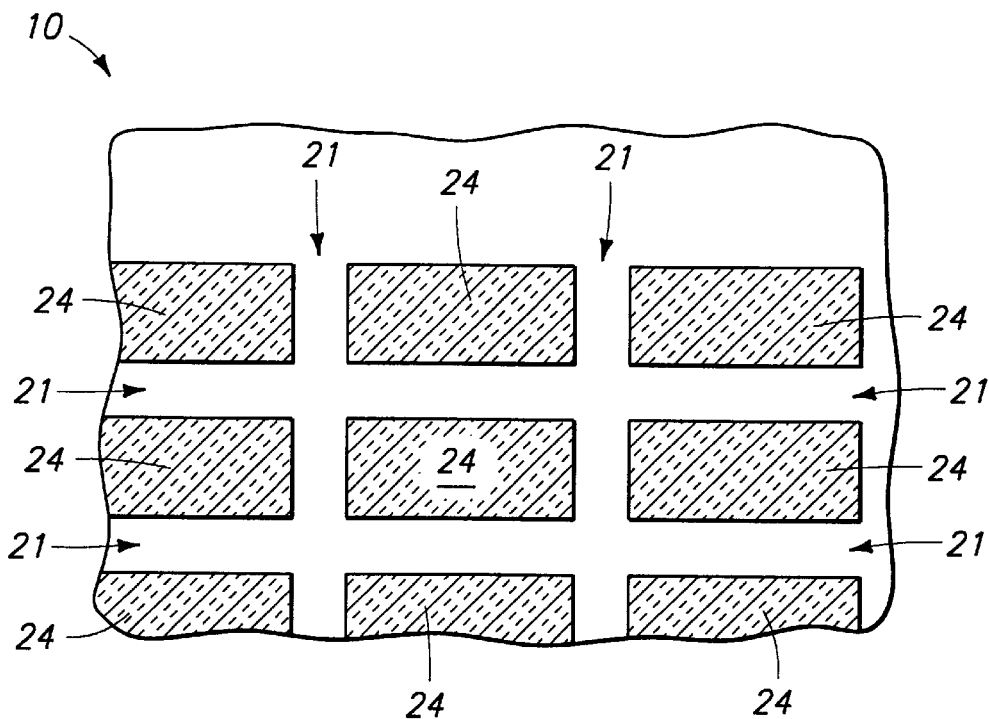
FIG. 21 is a top plan view of the FIG. 1 semiconductor wafer portion at a processing step just after the processing step shown in FIG. 1.

Collectively, insulating material 20 and underlying insulative material 14 constitute an isolation oxide grid which effectively separates the individual islands and electrically insulates the same from one another. FIG. 21 is a top view of wafer 10 and shows a portion of the isolation oxide grid at 21. Some of the insulating material 20 (FIG. 1) constitutes isolation oxide regions which are formed laterally adjacent the semiconductive material which constitutes individual islands 16. Such isolation oxide regions also include insulating material 20 which is formed laterally adjacent respective nitride-containing caps 24.

Figure 2:
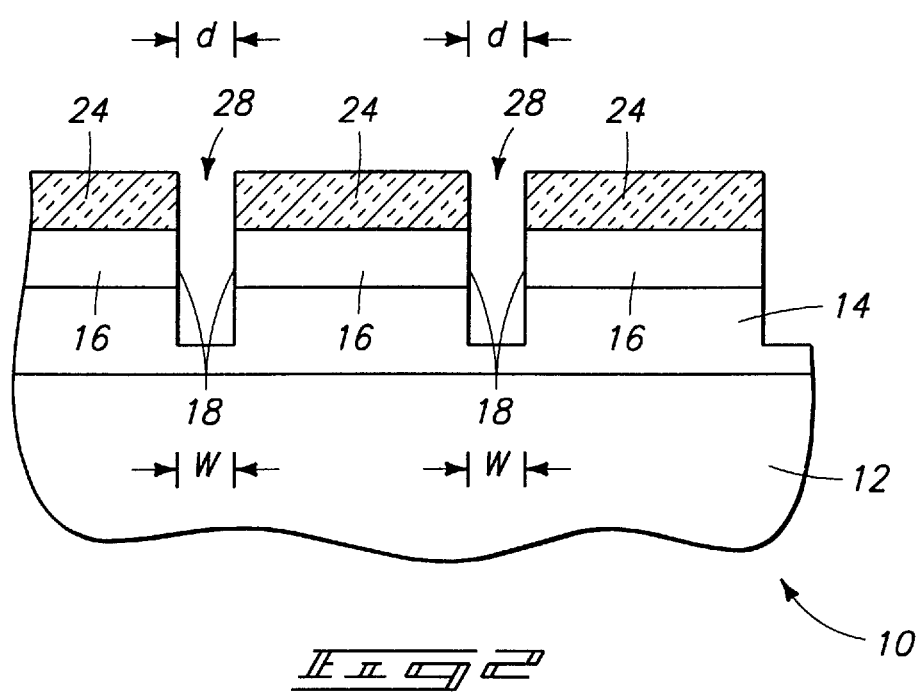
FIG. 2 is a diagrammatic section of the FIG. 1 semiconductor wafer portion at a processing step which is subsequent to that shown in FIG. 1.

Referring to FIG. 2, at least some of insulating material 20 occupying corresponding separation distances d is removed, such as by etching, to a degree effective to expose at least a portion of respective sidewalls 18 of adjacent islands 16. As shown, a portion of insulative layer 14 is also etched. Such etch constitutes an etch of the above-mentioned isolation oxide regions to a point which will be elevationally below conductive diffusion regions which are to be formed relative to islands 16, as will become apparent below. Moreover, such etch can be considered as part of the formation of a conductive line which is to be ultimately in electrical communication with one of the diffusion regions to be formed. The depth of such etch can extend elevationally downward to and terminate at the underlying silicon substrate 12. Preferably, the etch does not extend into substrate 12. In the illustrated example, such etch stops short of substrate 12 and etches into a portion of insulative material 14.

The illustrated etch defines a plurality or network of respective outwardly-exposed elongated trenches 28 between respective sidewalls 18 of laterally adjacent islands 16. As so formed, the trenches have respective lateral widths W in lateral width directions which lie in the plane of the page upon which FIG. 2 appears. In the illustrated example, each trench width W is approximately equal to the separation distance d between adjacent islands, owing to the fact that most, if not all of the corresponding isolation oxide formerly occupying that area has been removed. The trench width can be less than the separation distance.

Alternately considered, islands 16 constitute a plurality of upstanding silicon-containing structures which are formed over insulative oxide layer material 14. A network of conduits are formed or defined within the insulative material and between the individual islands. One implementation of the conduits constitutes the above-described trenches 28. Other conduit constructions are possible. As will become apparent below, the conduits provide a mechanism by which a conductive grid can be formed.

Figure 3:
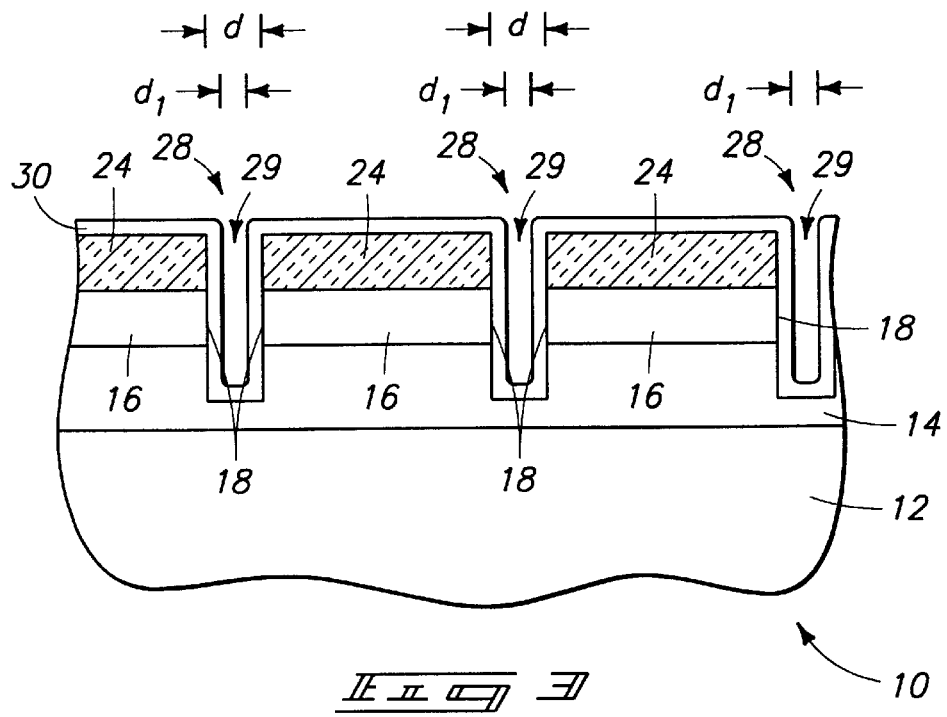
FIG. 3 is a diagrammatic section of the FIG. 1 semiconductor wafer portion at a processing step which is subsequent to that shown in FIG. 2.

Referring to FIG. 3, additional insulating material 30 is formed over the exposed island sidewalls 18 and to a degree which is sufficient to leave at least a portion of individual separation distances d unoccupied with any of the additional insulating material. The illustrated separation distances which are unoccupied with any of the additional insulating material are designated at $d_1$. In the illustrated and preferred embodiment, insulating material 30 constitutes a lining of $SiO_2$ which is chemical vapor deposited to a thickness which is approximately one third (⅓) of the separation distance d. Accordingly, $d_1$ is approximately equal to one third (⅓) of the separation distance d. Other spatial relationships are of course possible. As so formed or deposited, the oxide lining material 30 fills about two thirds (⅔) of the lateral width of each respective trench 28 in the lateral width direction to form associated troughs 29 for receiving conductive material described just below.

Figure 4:
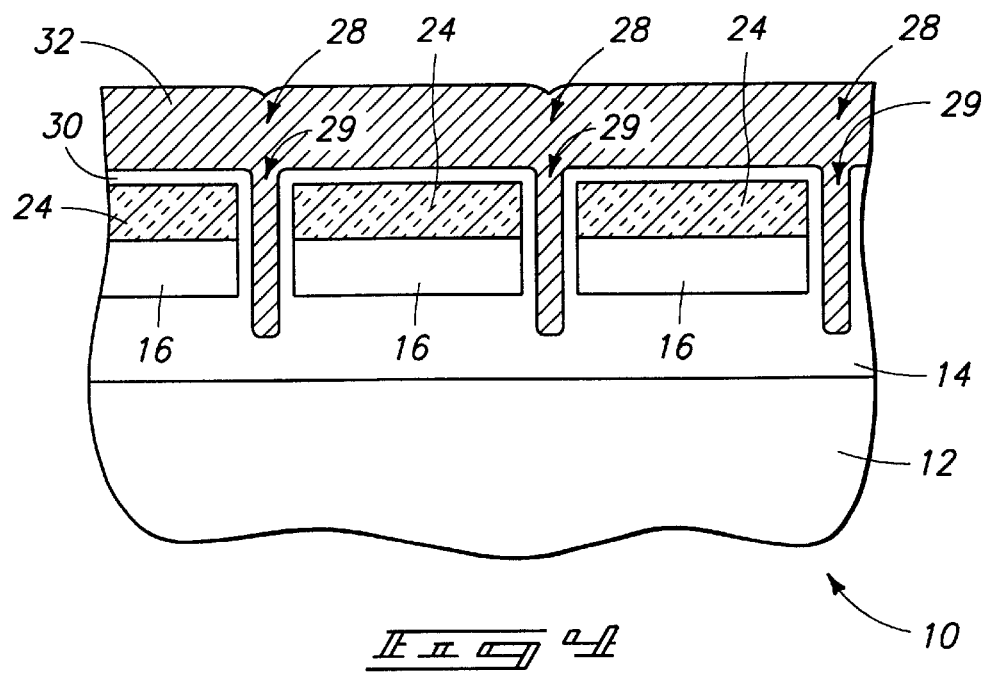
FIG. 4 is a diagrammatic section of the FIG. 1 semiconductor wafer portion at a processing step which is subsequent to that shown in FIG. 3.

Referring to FIG. 4, a first conductive material 32 is formed over the substrate, within each etched oxide isolation region and over oxide lining material 30 within each trough 29. In the illustrated and preferred embodiment, the conductive material is chemical vapor deposited and constitutes a suitable conductive material. Exemplary materials include polysilicon, either conductive as deposited and rendered conductive thereafter, and suitable refractory metals. Accordingly, first conductive material 32 is formed in the remaining portion of trench 28 which is unoccupied with any of the oxide lining material 30 (i.e. troughs 29). Accordingly, conductive material 32 replaces at least some of the etched insulating material 20 (FIG. 2) which was previously removed between islands 16. Some conductive material which replaces the etched insulating material is disposed laterally adjacent and between respective islands 16. As so formed, the conductive material is laterally spaced from conductive diffusion regions which are to be formed relative to islands 16 and which are described in detail below.

Figure 5:
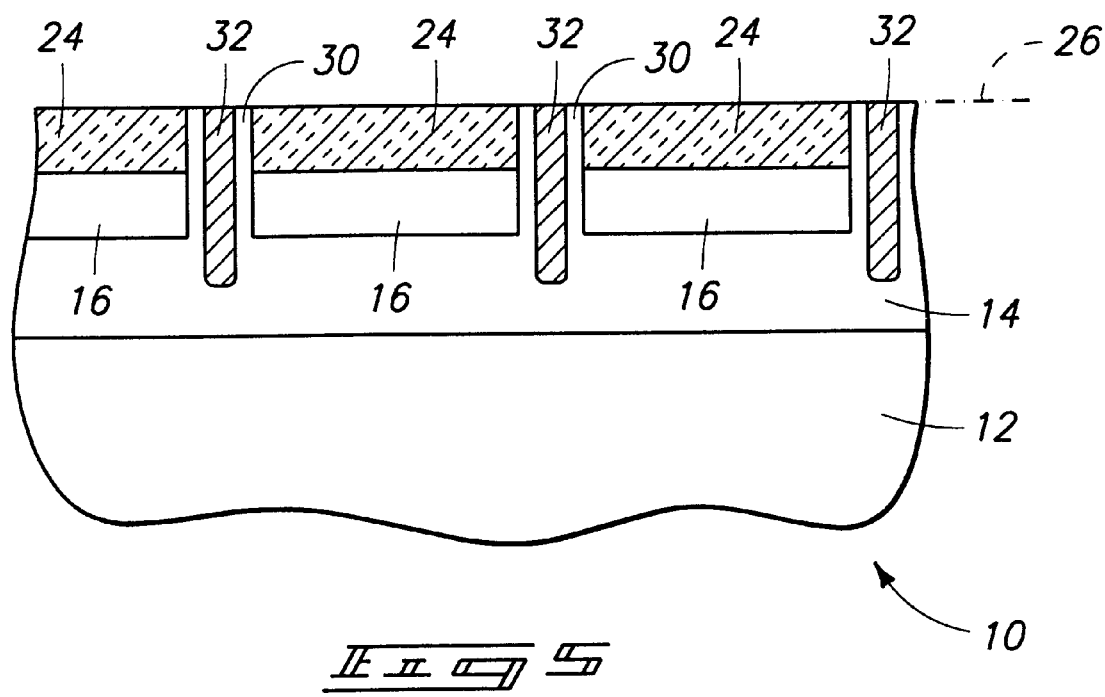
FIG. 5 is a diagrammatic section of the FIG. 1 semiconductor wafer portion at a processing step which is subsequent to that shown in FIG. 4.
Figure 22:
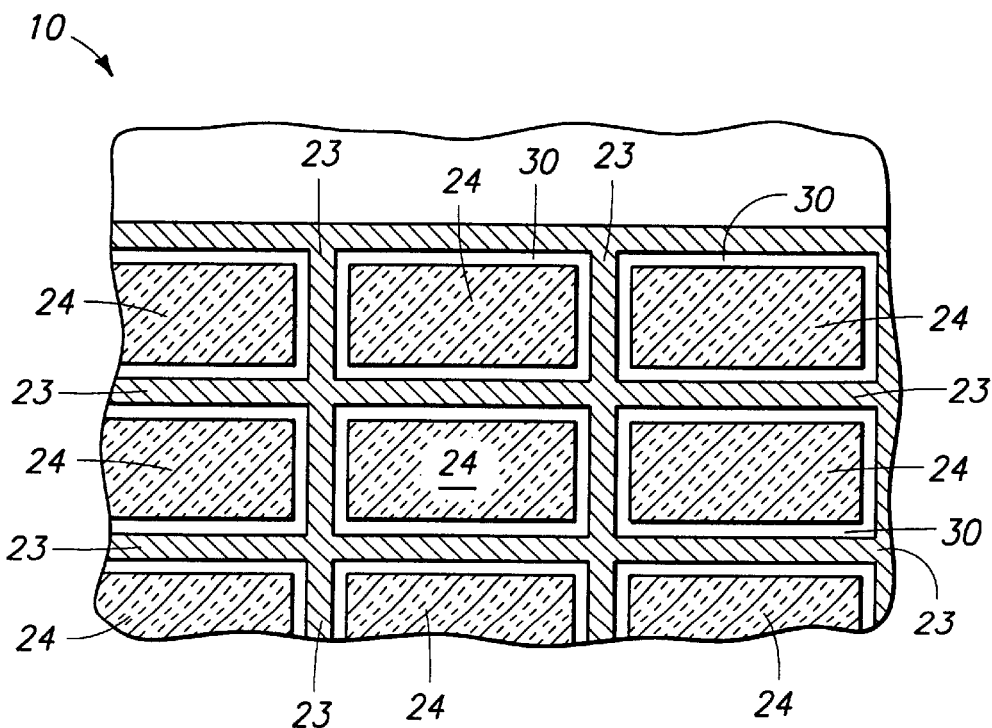
FIG. 22 is a top plan view of the FIG. 1 semiconductor wafer portion at a processing step just after the processing step shown in FIG. 5.

Referring to FIG. 5, conductive material 32 is planarized as by suitable mechanical abrasion of substrate 12 to a degree which is sufficient to isolate desired conductive material 32 relative to other laterally spaced conductive material. Such also preferably removes oxide lining material 30 which directly overlies (FIG. 4) the respective nitride-containing caps 24 which serve as a stopping level for the planarization step. Accordingly, the planarization defines a conductive network or grid which is formed within the isolation oxide. FIG. 22 is a top view of wafer 10 and shows a portion of the conductive network or grid at 23. The planarized oxide lining material 30 (FIG. 5) and conductive material 32 are substantially coplanar with the nitride-containing caps 24 at plane 26.

Figure 6:
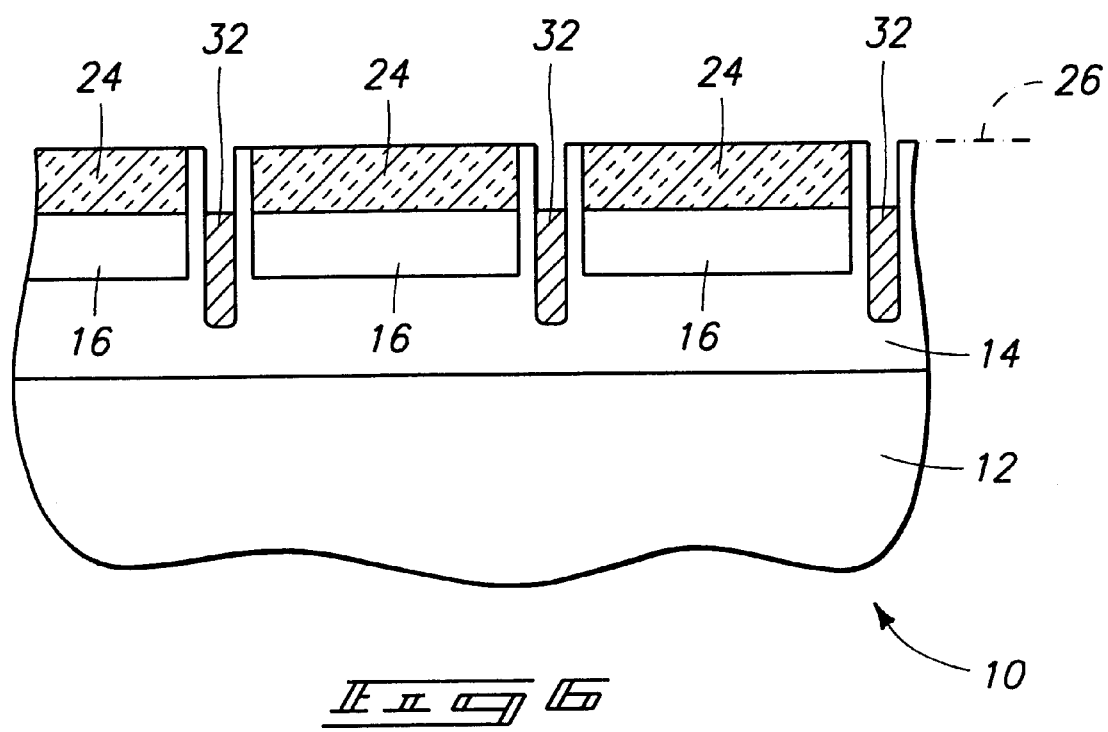
FIG. 6 is a diagrammatic section of the FIG. 1 semiconductor wafer portion at a processing step which is subsequent to that shown in FIG. 5.

Referring to FIG. 6, the resulting conductive material 32 is selectively etched or otherwise recessed to below an immediately adjacent planar surface, here, the outer surface of the nitride-containing caps 24. Preferably, material 32 is recessed about 1000 Angstroms inwardly relative to the immediately adjacent planar surface. As so recessed, the remaining conductive material constitutes a recessed conductive grid which is formed relative to and running within the oxide isolation grid.

Referring to FIG. 7, selected substrate areas are masked with photoresist 34. Such defines respective exposed areas, such as area 36, within which selected conductive material 32 is to be removed.

Referring to FIG. 8, conductive material is removed, such as by etching, from the unmasked substrate areas leaving the corresponding troughs 29 in area 36 empty. The removal of selected portions of the conductive material grid constitutes a definition step in which a plurality of interconnect lines are formed within the oxide isolation grid which corresponds to those areas which were masked. In the illustrated embodiment, the selected conductive material can be and preferably is removed by an etch which is selective to SiO₂ (the oxide lining material) and the nitride material from which caps 24 are formed (i.e. Si₃N₄).

Figure 23:
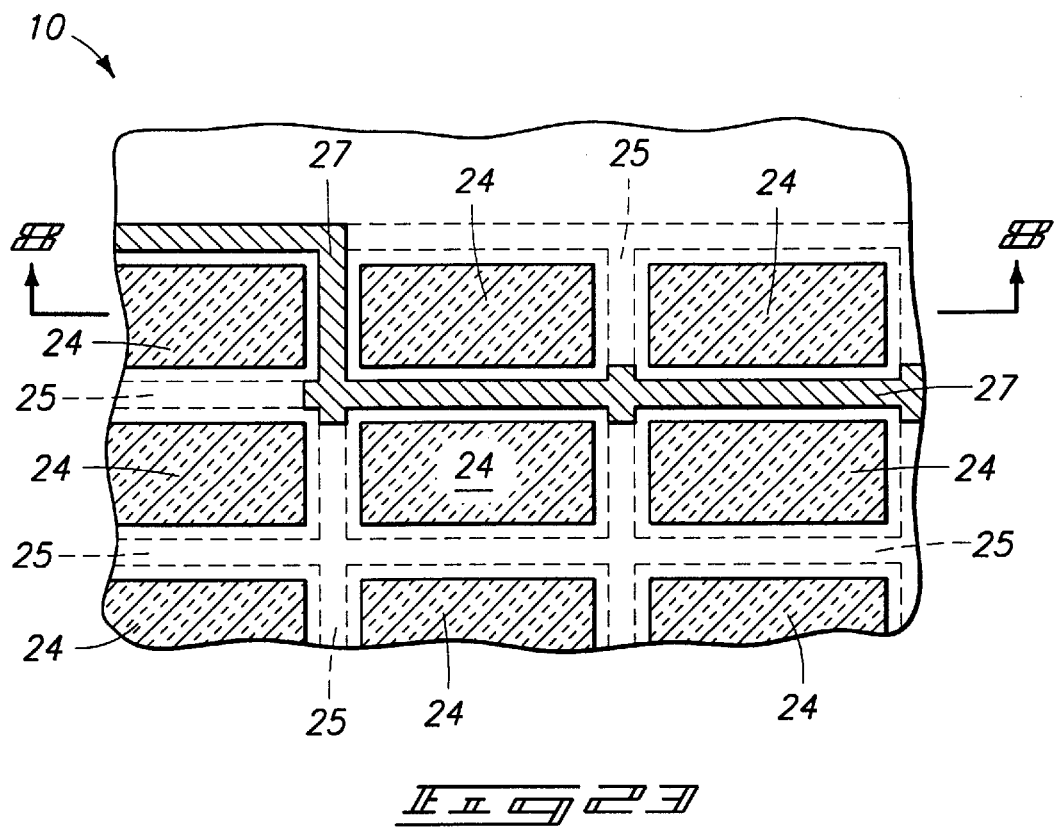
FIG. 23 is a top plan view of the FIG. 1 semiconductor wafer portion at a processing step intermediate the processing steps shown in FIGS. 7 and 8.

FIG. 23 is a top plan view of a portion of substrate 10 immediately following the removal of the selected portions of the conductive material grid and the stripping of photoresist just discussed. Accordingly, a plurality of exposed nitride-containing caps 24 which overlie associated silicon-containing islands 16 (FIG. 8) are shown. Selected areas or spaces between the caps contain dashed lines and represent the trenches from which conductive material has been removed. Exemplary areas are designated by reference numeral 25. Other areas, designated at 27, represent the trenches from which conductive material was not removed. Accordingly, such trenches 27 constitute some of the interconnect lines at least some of which will eventually be electrically interconnected to diffusion regions to be formed.

Referring back to FIG. 8 and following removal of the FIG. 7 photoresist 34, a layer of insulative material 38 is formed over substrate 12 as shown. Insulative material 38 preferably constitutes an oxide material such as SiO₂ which is chemical vapor deposited to a degree sufficient to fill in the empty troughs 29 from which conductive material was previously removed and to cover conductive material 32 which was not removed.

Referring to FIG. 9, insulative material 38 is planarized as by suitable mechanical abrasion to be substantially coplanar with nitride-containing caps 24.

Referring to FIG. 10, the nitride-containing caps are stripped away to outwardly expose the respective outer surfaces 22 of the silicon-containing structures or islands 16. The respective outer surfaces 22 define portions of individual active areas in which diffusion regions are to be formed. At this point, and in advance of forming the diffusion regions, however, threshold voltage implantations can take place to adjust the respective threshold voltages of transistor gates which are to be formed over and atop structures 16.

Figure 11:
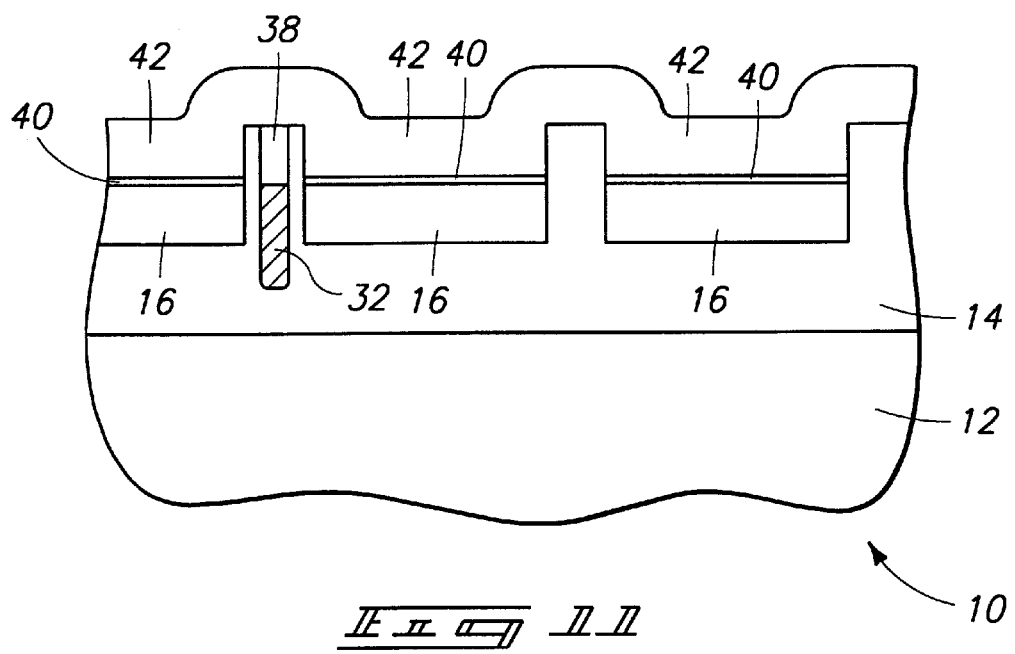
FIG. 11 is a diagrammatic section of the FIG. 1 semiconductor wafer portion at a processing step which is subsequent to that shown in FIG. 10.

Referring to FIG. 11, individual gate oxide layers 40 are formed over the respective silicon-containing structure outer surfaces. Subsequently, a polysilicon layer 42 is formed over respective gate oxide layers 40. Other materials suitable for use in forming transistor gates can be utilized.

Figure 12:
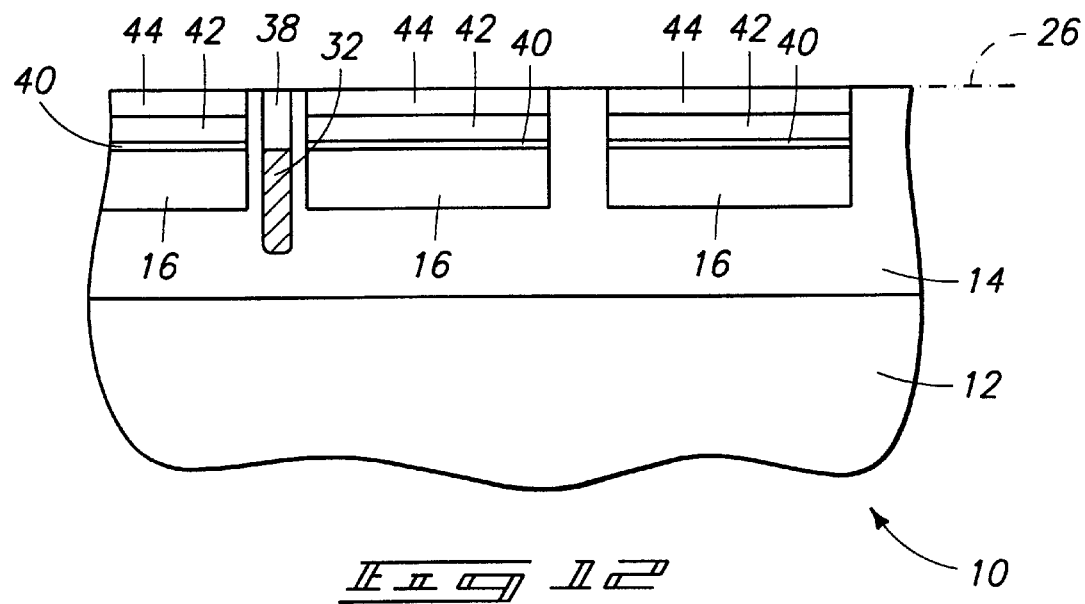
FIG. 12 is a diagrammatic section of the FIG. 1 semiconductor wafer portion at a processing step which is subsequent to that shown in FIG. 11.

The polysilicon material of layer 42 is then planarized as by suitable mechanical abrasion. The planarized polysilicon material is then recessed using a selective etch. An exemplary depth of such recess is about 500 Angstroms. Subsequently, an oxide layer is formed over the recessed polysilicon. Such can be accomplished through thermal oxidation or through chemical vapor deposition of SiO₂. An exemplary thickness of such formed oxide layer is about 1000 Angstroms. After the oxide layer formation, subsequent planarization thereof results in the FIG. 12 structure, where respective resultant oxide caps are shown at 44. Such provides a plurality of stack structures which are formed over individual silicon-containing structures 16 and between isolation oxide which extends outward of the individual islands or structures. Each such stack structure constitutes multiple transistor-forming layers which include layers 40, 42, and 44.

Figure 13:
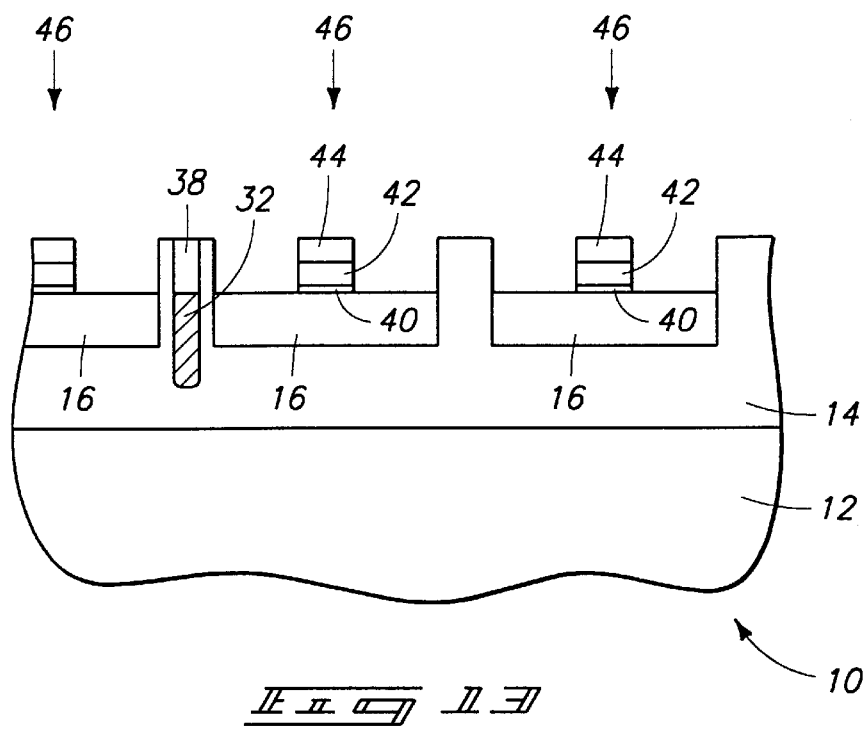
FIG. 13 is a diagrammatic section of the FIG. 1 semiconductor wafer portion at a processing step which is subsequent to that shown in FIG. 12.

Referring to FIG. 13, individual stack structures are patterned and etched to form individual gate structures or transistor gates 46 over the silicon-containing structures 16.

Figure 14:
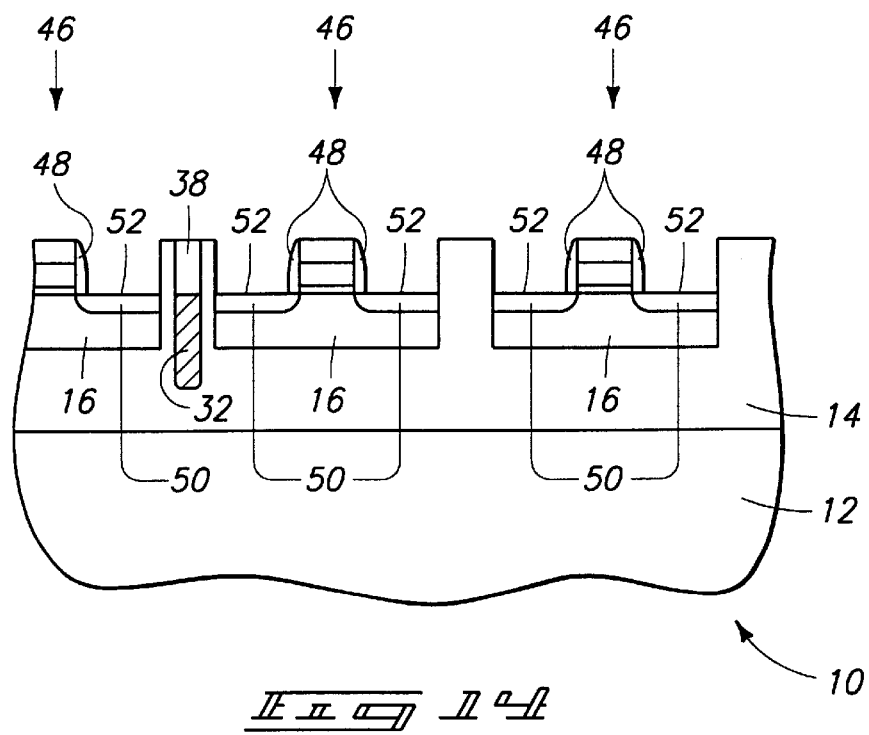
FIG. 14 is a diagrammatic section of the FIG. 1 semiconductor wafer portion at a processing step which is subsequent to that shown in FIG. 13.

Referring to FIG. 14, insulative or insulating sidewall spacers 48 are formed over respective sidewalls of the individual transistor gates 46. Conductive source/drain diffusion regions or node locations 50 are formed within the semiconductive material which constitutes individual islands 16. Each diffusion region 50 has an associated outer surface 52. In the illustrated and preferred embodiment, remaining conductive material 32 constitutes a conductive line a portion of which is laterally spaced from structure 16 and associated diffusion regions 50. A predominate portion and preferably all of the conductive line is disposed elevationally below the diffusion region outer surface 52 as shown. In the illustrated example, each diffusion region is formed between spaced apart isolation oxide regions. Portions of such spaced apart isolation oxide regions are shown to extend elevationally above or outward of and adjacent the respective islands in which such diffusion regions are formed. Other portions of some of the same isolation oxide regions are shown to contain conductive material 32.

Referring to FIG. 15, insulative material 54 is formed over the substrate and to a degree which is sufficient to cover the individual transistor gates 46 and a associated diffusion regions 50. Exemplary insulative materials include SiO₂ and other suitable insulators.

Referring to FIG. 16, insulative material 54 is planarized as by suitable mechanical abrasion.

Referring to FIG. 17, a layer of masking material 56 is formed over insulative material 54 and patterned to define a mask opening 58 elevationally over the conductive material of line 32. Preferably the mask opening overlaps with a portion of one of the diffusion regions 50 so that a subsequent etch can outwardly expose at least a portion of both the diffusion region and the conductive line.

Referring to FIG. 18, insulative material 54 is so etched to outwardly expose a portion of the illustrated diffusion region 50 and conductive material 32. Masking material 56 (FIG. 17) is subsequently removed.

Figure 19:
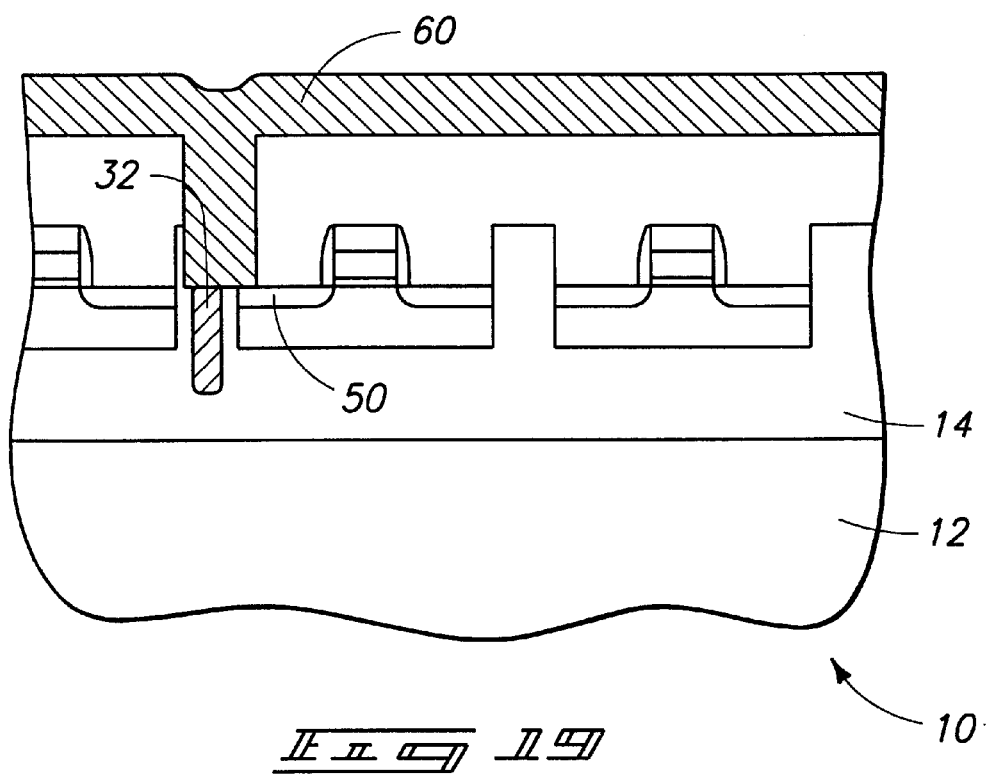
FIG. 19 is a diagrammatic section of the FIG. 1 semiconductor wafer portion at a processing step which is subsequent to that shown in FIG. 18.

Referring to FIG. 19, a second conductive material 60 is formed over the substrate, the exposed diffusion region 50 and the conductive material 32 and forms a connective electrical interconnection between the latter components. The first conductive material 32 and the second conductive material 60 can comprise the same or different materials. Exemplary materials include doped polysilicon or undoped polysilicon which is subsequently rendered conductive by masked doping implants. Other suitable materials include refractory metals. A preferred manner of forming material 60 over the substrate is by chemical vapor deposition.

Figure 20:
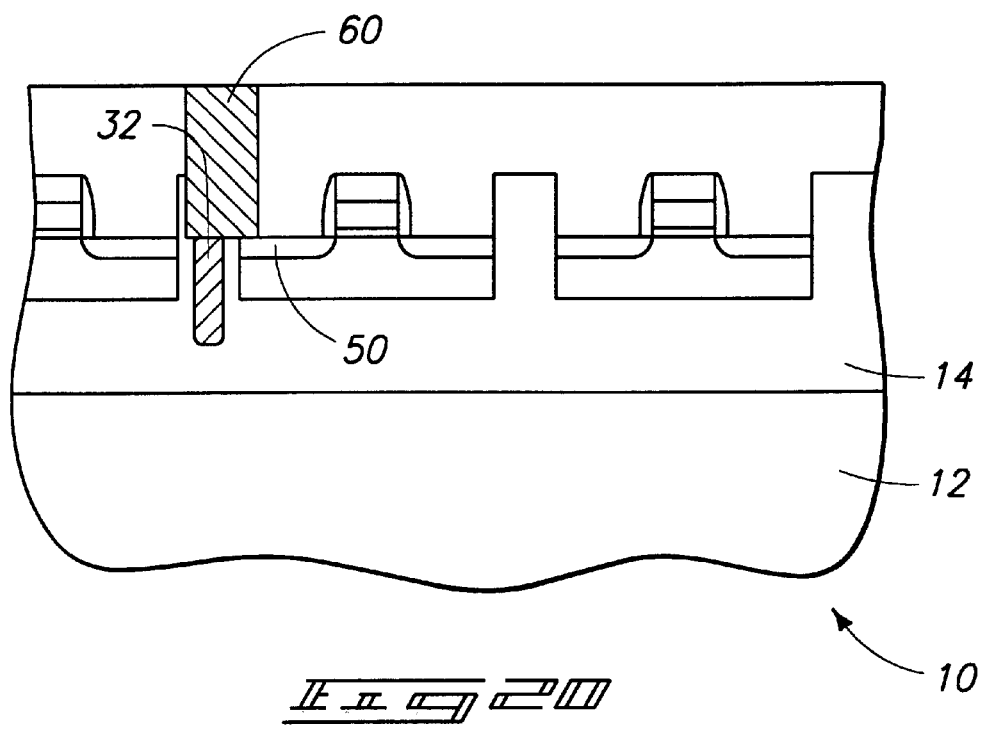
FIG. 20 is a diagrammatic section of the FIG. 1 semiconductor wafer portion at a processing step which is subsequent to that shown in FIG. 19.

Referring to FIG. 20, material 60 is planarized as by suitable mechanical abrasion to form the preferred conductive network.

The above-described methodology is directed to fabrication of the preferred integrated circuitry utilizing an SOI substrate. For purposes of illustration only, the above has been described in the context of forming only one transistor relative to an associated silicon-containing island. More than one transistor, however, can be formed atop an individual island. For example, in the context of dynamic random access memory (DRAM) devices, suitably dimensioned islands can be formed for supporting and accommodating multiple transistor constructions which constitute the DRAM's memory cells (e.g. access transistors and storage capacitors).

Figure 24:
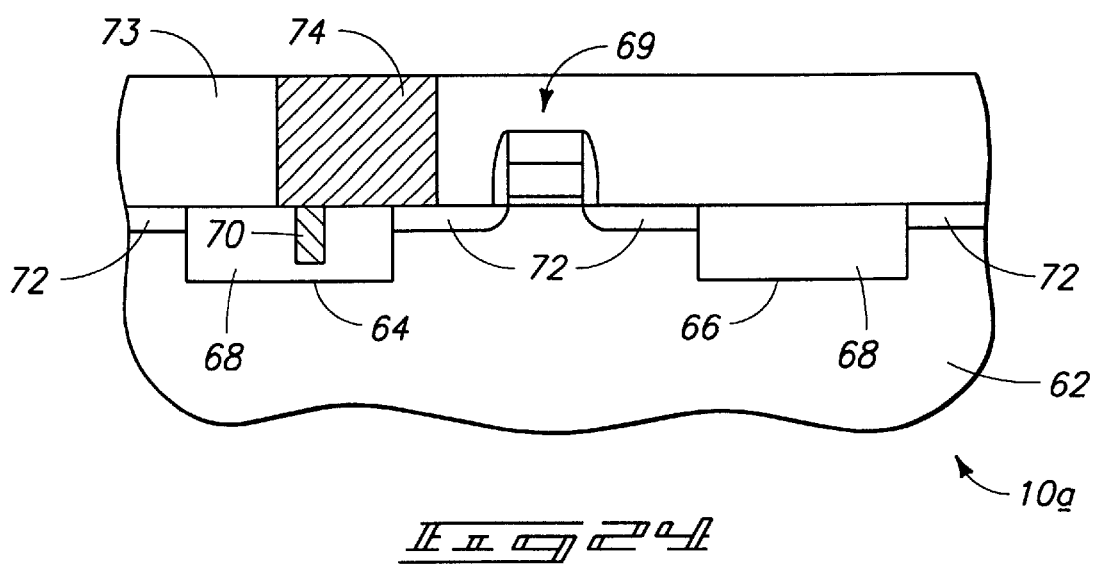
FIG. 24 is a diagrammatic section view of a semiconductor wafer at one processing step of a processing method in accordance with an alternate embodiment of the invention.

Referring to FIG. 24, an alternate construction and one which is is appropriate for use in connection with conventional bulk silicon technology is set forth. Accordingly, a semiconductor wafer fragment is indicated generally by reference numeral 10*a*. Such comprises a bulk silicon substrate 62. A plurality of laterally spaced isolation trenches 64, 66 are conventionally formed within the substrate and thereafter filled with isolation oxide 68 to define isolation oxide regions. The isolation oxide regions define therebetween a substrate active area. In the illustrated example, a single transistor construction 69 is supported by the substrate active area. More than one transistor construction can be supported by such active areas. As so formed, the isolation trenches are disposed laterally adjacent the substrate active area. Each isolation oxide region has a lateral width which lies in the plane of the page upon which FIG. 24 appears. In accordance with the inventive methodical aspects described above, some of the isolation oxide, preferably portions which are disposed intermediate the lateral width are removed. Such corresponds to the left-most isolation oxide region. In both the SOI and the bulk embodiments, the removed isolation oxide is preferably greater in an elevationally downward direction than a laterally outward direction. Some of the removed isolation oxide is thereafter replaced with first conductive material 70. Conductive material 70 as so formed is disposed laterally adjacent one of a pair of source/drain diffusion regions 72 which forms part of the transistor construction 69. The diffusion region 72 closest to conductive material 70 constitutes a node location with which electrical connection is to be made. An insulative material 73 is formed over the substrate and subsequently etched to outwardly expose at least some of both of the conductive material 70 and the diffusion region 72. Second conductive material 74 is formed over the first conductive material the adjacent diffusion region 72 to provide an electrical connection therebetween. The first and second conductive materials can constitute the same or different materials, such materials being discussed above in connection with the SOI embodiment. As so formed, the predominate portion of first conductive material 70 extends below the diffusion region outer surface.

Although the bulk embodiment has been described in the context of isolation oxide regions which are formed utilizing a trench and refill technique, other methods of forming the oxide isolation regions, such as local oxidation of silicon (LOCOS) can be used. And, as With the SOI embodiment, the conventional bulk embodiment can be modified to support more than one transistor construction which, by way of example, would be suitable for use in forming DRAM memory cells. Accordingly, such integrated memory circuitry, whether fabricated in connection with the SOI or bulk embodiments constitutes a plurality of source/drain diffusion regions which are supported by an appropriate substrate. A plurality of isolation oxide regions are supported by the substrate and interposed between and separate at least some of the diffusion regions. A plurality of conductive lines are supported by the substrate as described above, at least some of which being operatively connected with at least some of the diffusion regions and disposed within an associated isolation oxide region.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrical connection with a transistor source/drain region of silicon-on-insulator substrate including a plurality of spaced-apart semiconductive material islands formed over an insulator, individual islands having respective outer surfaces comprising:
    forming at least one transistor gate over at least one of the outer surfaces;
    forming at least one source/drain region within semiconductive material laterally adjacent the at least one transistor gate;
    forming a first conductive material laterally and electrically separated from the one source/drain region by the insulator; and
    forming a second conductive material in electrical connection with the first conductive material and the one source/drain region.

2. The method of forming the electrical connection with the transistor source/drain region of claim 1, wherein forming a first conductive material comprises forming the first conductive material to extend elevationally below the outer surface over which the at least one gate is formed.

3. The method of forming the electrical connection with the transistor source/drain region of claim 1, wherein forming the first conductive material comprises:
    etching the insulator between adjacent islands; and
    replacing at least some of the etched insulator with the first conductive material.

4. The method of forming the electrical connection with the transistor source/drain region of claim 1, wherein:
    respective separation spaces are defined between adjacent islands, at least some of the separation spaces being occupied with the insulator; and
    forming the first conductive material comprises:
        removing at least some of the insulator occupying at least one of the separation spaces; and
        replacing some of the removed insulator with sufficient first conductive material to only partially occupy the one separation space.

5. The method of forming the electrical connection with the transistor source/drain region of claim 1, wherein:
    individual islands have respective sidewalls and define respective separation spaces between adjacent island sidewalls, at least some of the separation spaces between island sidewalls being occupied with the insulator; and
    forming the first conductive material comprises:
        etching at least some of the insulator occupying at least one of the separation spaces to expose at least a portion of an island sidewall;
        forming insulating material over the exposed island sidewall portion and leaving some of the separation space unoccupied with insulator; and
        forming first conductive material within the unoccupied separation space.

6. The method of forming the electrical connection with the transistor source/drain region of claim 1, wherein the first conductive material and the second conductive material comprise the same material.

7. The method of forming the electrical connection with the transistor source/drain region of claim 1, wherein the first conductive material and the second conductive material comprise different materials.

8. The method of forming the electrical connection with the transistor source/drain region of claim 1, wherein forming the second conductive material comprises forming the second conductive material over and in electrical connection with the first conductive material.

9. A method of forming at least one interconnection to a node in silicon-on-insulator integrated circuitry comprising:

forming a conductive node in a silicon-containing structure, the structure being formed over and surrounded by isolation oxide;

forming a first conductive material laterally adjacent the silicon-containing structure; and forming a second conductive material electrically connecting the first conductive material and the node.

10. The method of claim 9, wherein forming a first conductive material comprises forming a first conductive material such that a predominate portion of the first conductive material is disposed elevationally below the node.

11. The method of claim 9, wherein the first conductive material and the second conductive material comprise the same material.

12. The method of claim 9, wherein the first conductive material and the second conductive material comprise different materials.

13. The method of claim 9, wherein forming the first conductive material comprises:

etching the isolation oxide and exposing at least a portion of the silicon-containing structure, the etching defining an elongated trench for receiving first conductive material; and filling at least a portion of the trench with first conductive material.

14. The method of claim 9, wherein forming the first conductive material comprises:

etching the isolation oxide and exposing at least a portion of the siliconcontaining structure, the etching defining an elongated trench for receiving first conductive material;

depositing an insulator within the trench and over the exposed portion of the silicon-containing structure, the insulator defining a trough within the trench; and filling at least a portion of the trough with first conductive material.

15. The method of claim 9, wherein forming the first conductive material comprises:

etching the isolation oxide to a degree sufficient to expose a silicon-containing sidewall of the silicon-containing structure and a silicon-containing sidewall of another, laterally adjacent, silicon-containing structure, the two silicon-containing sidewalls generally facing one another and defining a trench therebetween;

forming an insulator lining within the trench and over the two silicon-containing sidewalls, the insulator lining defining a trough within the trench; and forming first conductive material within at least a portion of the trough and over at least some of the insulator lining.

16. The method of claim 9, wherein forming the second conductive material comprises forming the second conductive material over and in electrical connection with the first conductive material.

17. A method of forming a silicon-on-insulator transistor and a connection thereto comprising:

forming trenches extending through a silicon layer and into an insulator beneath the silicon layer, the trenches electrically separating portions of the silicon layer into islands having respective outer surfaces;

forming a layer of insulator within the trenches to provide troughs extending below a level of the outer surfaces;

forming a first conductor within the troughs;

selectively removing portions of the first conductor to provide respective first conductive lines, the first conductive lines being configured to be electrically coupled to respective source or drain regions;

forming at least one gate on at least one of the islands; and forming source and drain regions laterally adjacent the at least one gate.

18. The method of claim 17, further comprising forming second conductive lines selectively coupling respective first conductive lines to respective source or drain regions.

19. The method of claim 18, wherein the first conductive lines and the second conductive lines comprise the same material.

20. The method of claim 18, wherein the first conductive lines and the second conductive lines comprise different materials.

21. The method of claim 17, wherein forming the first conductor includes forming the first conductor comprising polysilicon.

22. The method of claim 17, wherein forming the first conductor within the troughs comprises forming the first conductor within the troughs such that a predominate portion of the first conductive lines is disposed elevationally below the node.

23. The method of claim 18, wherein forming second conductive lines comprises forming a second conductor over and in electrical connection with the first conductor.

24. A method of forming a silicon-on-insulator transistor and a connection thereto comprising:

forming trenches extending through a silicon layer and electrically separating portions of the silicon layer into islands having respective outer surfaces;

forming an insulator within the trenches to provide troughs extending below a level of the outer surfaces;

forming first conductive lines within the troughs, at least some of the first conductive lines being configured to electrically couple to respective source or drain regions;

forming at least one gate on at least one of the islands; and forming source and drain regions laterally adjacent the at least one gate.

25. The method of claim 24, further comprising forming second conductive lines selectively coupling respective first conductive lines to respective source or drain regions.

26. The method of claim 24, wherein forming first conductive lines comprises:

forming a first conductor within the troughs; and selectively removing portions of the first conductor to provide respective first conductive lines.

27. The method of claim 25, wherein the first conductive lines and the second conductive lines comprise the same material.

28. The method of claim 25, wherein the first conductive lines and the second conductive lines comprise different materials.

29. The method of claim 24, wherein forming the first conductive lines includes forming the first conductive lines to comprise polysilicon.

30. The method of claim 24, wherein forming the first conductive lines within the troughs comprises forming the first conductive lines within the troughs such that a predominate portion of the first conductive lines is disposed elevationally below the node.

31. The method of claim 25, wherein forming second conductive lines comprises forming second conductive lines over and in electrical connection with the first conductive lines.

* * * * *

UNITED STATES PATENT AND TRADEMARK OFFICE
CERTIFICATE OF CORRECTION

PATENT NO. : 6,509,213 B2
DATED : January 21, 2003
INVENTOR(S) : Wendell P. Noble It is certified that error appears in the above-identified patent and that said Letters Patent is hereby corrected as shown below:

Title page,
Item [57], ABSTRACT,
Line 16, please replace "a plurality of oxide insolation is regions are formed" with
-- a plurality of oxide insolation regions are formed --
Line 19, please replace "a silicon-on-insulator." with -- a silicon-on-insulator --

Column 4,
Line 37, please replace "the. silicon-containing wafer to a desired depth.." with
-- the silicon-containing wafer to a desired depth. --

Column 5,
Line 9, please replace "depositing a silicon layer and a, nitride layer" with
-- depositing a silicon layer and a nitride layer --

Column 8,
Line 19, please replace "individual transistor gates 46 and a associated" with
-- the individual transistor gates 46 and associated --

Column 9,
Lines 29 & 30, please replace "an electrical connection ther-ebetween." with
-- an electrical connection there-between. --
Line 40, please replace "And, as With SOI embodiment," with
-- And, as with the SOI embodiment, --

Column 11,
Line 30, please replace "of the siliconcontaining structure, the etching defining" with
-- of the silicon-containing structure, the etching defining --

Signed and Sealed this

Twelfth Day of August, 2003

JAMES E. ROGAN
*Director of the United States Patent and Trademark Office*